(12) United States Patent
Benzel et al.

(10) Patent No.: US 7,419,581 B2
(45) Date of Patent: Sep. 2, 2008

(54) METHOD FOR PRODUCING OPTICALLY TRANSPARENT REGIONS IN A SILICON SUBSTRATE

(75) Inventors: Hubert Benzel, Pliezhausen (DE); Heribert Weber, Nuertingen (DE); Hans Artmann, Magstadt (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 505 days.

(21) Appl. No.: 10/474,968

(22) PCT Filed: Mar. 5, 2002

(86) PCT No.: PCT/DE02/00798

§ 371 (c)(1),
(2), (4) Date: Mar. 31, 2004

(87) PCT Pub. No.: WO02/084748

PCT Pub. Date: Oct. 24, 2002

(65) Prior Publication Data

US 2004/0155010 A1    Aug. 12, 2004

(30) Foreign Application Priority Data

Apr. 14, 2001  (DE) ............................... 101 18 568

(51) Int. Cl.
*B81B 1/00* (2006.01)
*H01L 31/028* (2006.01)
*H01L 31/18* (2006.01)

(52) U.S. Cl. .............. 205/640; 205/646; 257/E21.215; 257/E21.232

(58) Field of Classification Search ......... 205/640–686; 216/2, 56; 257/E21.215, E21.232
See application file for complete search history.

(56) References Cited

U.S. PATENT DOCUMENTS

| 4,680,963 A | * | 7/1987 | Tabata et al. .............. 73/204.18 |
| 5,231,878 A | | 8/1993 | Zanini-Fisher et al. |
| 5,387,803 A | * | 2/1995 | Kurtz et al. ..................... 257/3 |
| 5,461,001 A | * | 10/1995 | Kurtz et al. ..................... 438/51 |
| 5,542,558 A | * | 8/1996 | Benz et al. ...................... 216/2 |
| 5,997,713 A | * | 12/1999 | Beetz et al. .................. 205/124 |
| 6,359,276 B1 | * | 3/2002 | Tu ........................... 250/338.1 |

FOREIGN PATENT DOCUMENTS

| DE | 198 03 852 | 8/1999 |
| EP | 0 490 764 | 6/1992 |
| FR | 90 156 58 | 6/1992 |
| JP | 61 170618 | 8/1986 |
| JP | 4 295724 | 10/1992 |

OTHER PUBLICATIONS

G. Lammel et al., "Free-standing, mobile 3D porous silicon microstructures," Swiss Fed. Inst. Of Technology, Lausanne, Switzerland, Elsevier Science, Sensor and Actuators 85 (2000) pp. 356-360.

* cited by examiner

Primary Examiner—Harry D. Wilkins, III
Assistant Examiner—Nicholas A. Smith
(74) Attorney, Agent, or Firm—Kenyon & Kenyon LLP

(57) ABSTRACT

A simple and cost-effective possibility is proposed for producing optically transparent regions (5, 6) in a silicon substrate (1), by the use of which both optically transparent regions of any thickness and optically transparent regions over a cavity in a silicon substrate are able to be implemented.

For this purpose, first at least a specified region (5, 6) of the silicon substrate (1) is etched porous. Thereafter, the specified porous region (5, 6) of the silicon substrate (1) is oxidized.

15 Claims, 3 Drawing Sheets

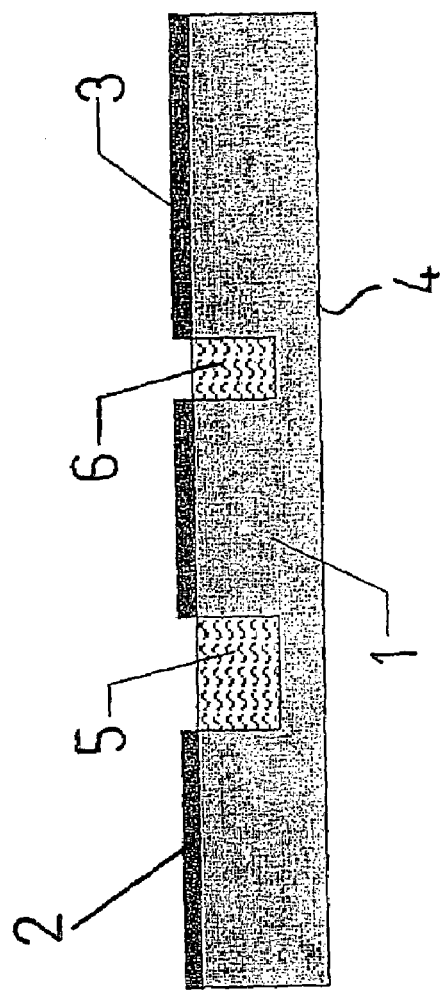
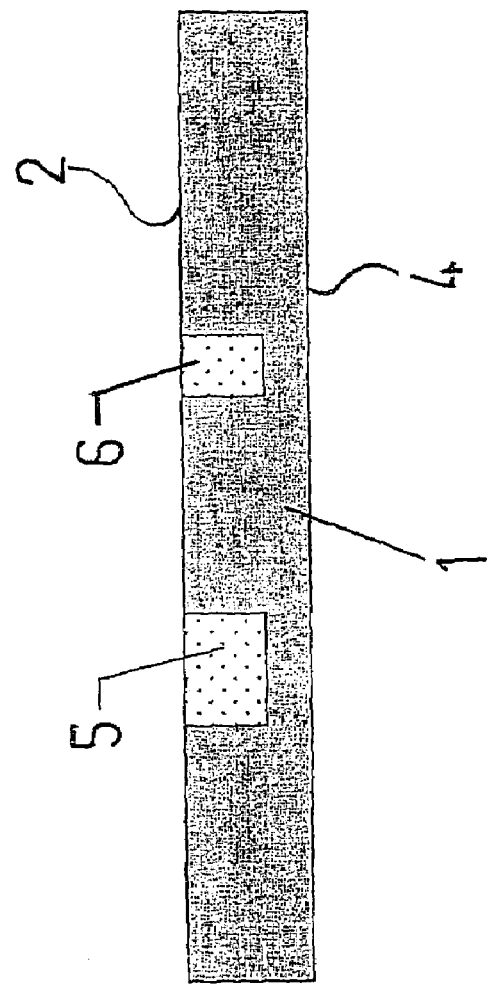

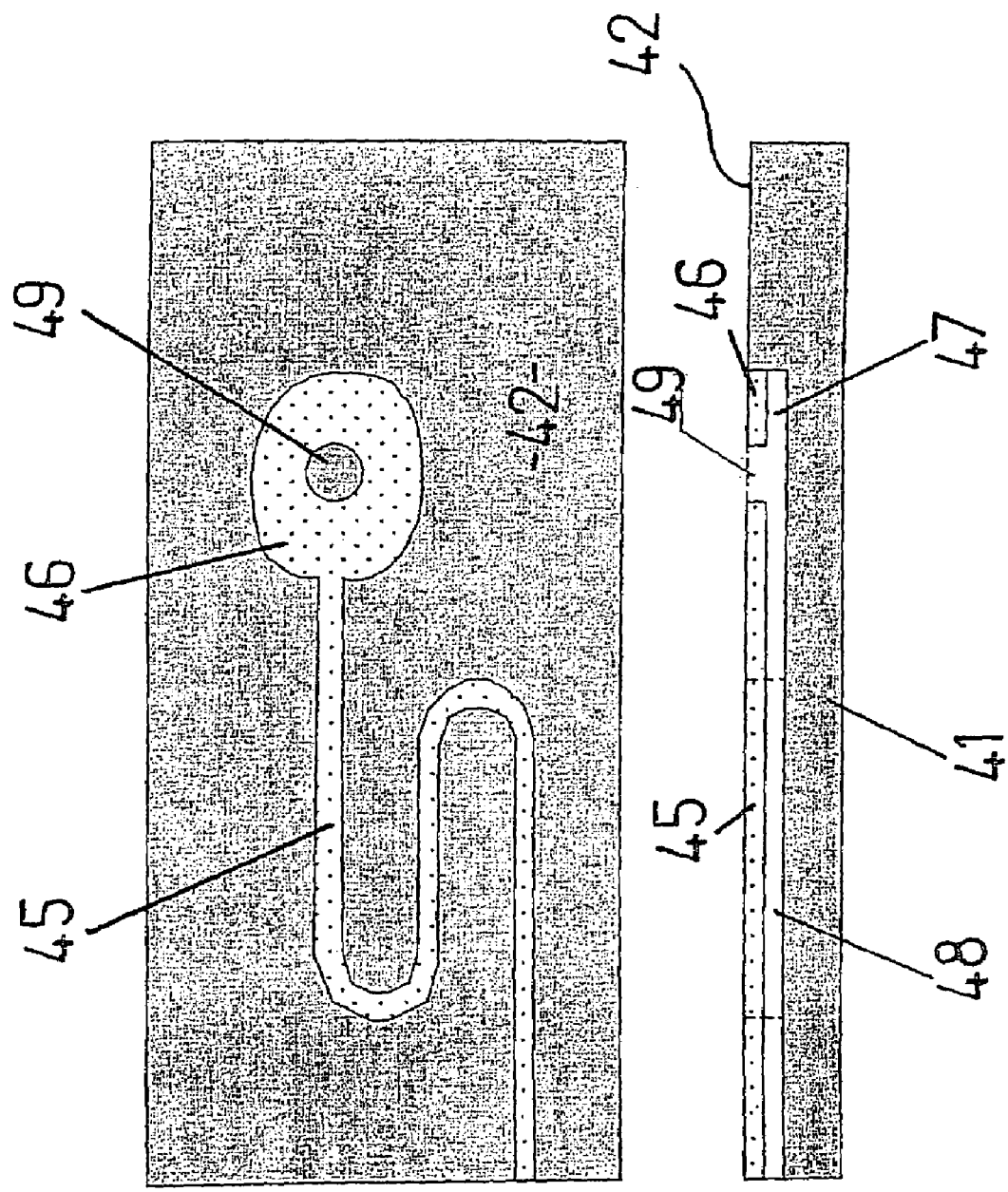

METHOD FOR PRODUCING OPTICALLY TRANSPARENT REGIONS IN A SILICON SUBSTRATE

FIELD OF THE INVENTION

The present invention relates to a method for producing optically transparent regions in a silicon substrate as well as a structure formed in a silicon substrate which is able to be produced by such a method.

BACKGROUND INFORMATION

Silicon oxide has approximately the same optical properties as quartz glass, i.e. is transparent in the visible spectrum range. In practice, in order to manufacture transparent regions in connection with a silicon substrate, silicon oxide layers are deposited on the silicon substrate which are subsequently structured.

However, the conventional method is problematical from several points of view. For example, using the conventional method, only optically transparent regions having a small layer thickness can be generated. Besides that, the manufacturing of such an optically transparent region over a cavity in the silicon substrate cannot be done in a simple manner, so that the optically transparent regions made within the framework of the conventional method, as a rule, cannot be used as an optically transparent cover for a cavity or fluid channel, as are needed, for example, for optical investigations on the smallest quantities of fluids in medicine or in analytical work.

SUMMARY

An example embodiment of the present invention provides a simple and cost-effective possibility for producing optically transparent regions in a silicon substrate, by the use of which both optically transparent regions of any thickness and optically transparent regions over a cavity in a silicon substrate are able to be implemented.

For this purpose, according to the present invention, at least one specified region of the silicon substrate is etched porous. Thereafter, the specified porous region of the silicon substrate is oxidized.

Starting from the fact that silicon oxide is suitable for implementing optically transparent regions in a silicon substrate, it has been recognized according to the present invention that the silicon oxide does not have to be deposited on the substrate surface, but may also be produced in the silicon substrate itself, if a sufficiently large surface of action can be created for the oxidation of the silicon. Therefore, according to the present invention, it is proposed that one should etch the silicon substrate porous where a transparent region is to be created. Within the framework of a subsequent oxidation process, the silicon is then changed into the optically transparent silicon oxide in the porous region.

Since the silicon substrate may be etched porous to any depth, without a problem, optically transparent regions may simply be produced in this manner which extend to any depth in the silicon substrate and also extend over the entire thickness of the silicon substrate. Besides, porous regions in the silicon substrate may also be simply undercut in etching, so that the method according to the present invention also provides the possibility of implementing optically transparent regions over a cavity in the silicon substrate.

Basically there are various possibilities of implementing the method according to the present invention, and especially for selecting a suitable etching process.

One possibility is to etch porous the specified region of the silicon substrate in an electrochemical etching process. In this connection, electrochemical anodizing turns out to be especially advantageous. Here, the material removal takes place in response to current flow at the anodic side of the silicon substrate, i.e., at the side of the silicon substrate contacted by the anode.

Particularly good results are achieved by anodizing if a hydrofluoric acid-containing medium is used as the etching solution. In this context, for example, a hydrofluoric acid-ethanol solution may be involved, or an aqueous hydrofluoric acid solution which may additionally be provided with wetting agents.

Whereas the depth of the specified porous region may simply be predefined by the duration of the etching process, the porosity produced in the etching process is dependent on various parameters, such as the doping of the silicon substrate, the concentration of the etching solution and the current strength present during etching at the silicon substrate during the etching process. The porosity may also be influenced by one or more of these parameters in a targeted manner.

Within the scope of the oxidation process, the porous silicon substrate experiences a volume increase which may lead to strains in the silicon substrate and, as a result, to defects in the structure and/or the function of the component produced from the silicon substrate. On the other hand, a residual porosity remaining after the oxidation, or an incomplete oxidation of the porous region, has a negative effect on the mechanical and optical properties of the transparent region. Therefore, the etching process and the oxidation conditions, particularly the duration of oxidation, should be adjusted to one another. In this context, it is especially advantageous if the porosity generated in the specified region is so great that the pores are completely closed because of the volume growth at complete through-oxidation, without warping appearing in the silicon substrate. A porosity of the silicon substrate of ca 54% has proven to be suitable for this.

To produce locally limited porous regions as a precursor of locally limited optically transparent regions in the silicon substrate, the use of etching masks has proven useful, which are applied to at least one surface of the silicon substrate, and which thereby define the regions to be etched, at least in this plane. The use of a metal mask as the etching mask has shown itself as being particularly advantageous, particularly if the porosity is to be generated in an electrochemical etching process. For in this case, the current flow runs perpendicular to the substrate surface, so that no undercutting of the metal mask takes place. Optionally, in addition, a metal mask may also be applied to the other side of the silicon substrate, so as to guide the flux lines even better. But as etching mask one may also consider a silicon nitride mask or an $n^+$ doping, if necessary, in connection with an additional silicon nitride mask.

As described above, the optically transparent regions produced by the method according to the present invention can advantageously be used as a cover for the cavities and channels in the silicon substrate. In one advantageous further development of an example method according to the present invention, such cavities are generated underneath the specified porous region in that the etching process is continued as a cavity etching process under conditions in which the silicon substrate is etched out completely, particularly in that the etching process is continued using a lower concentration of etching solution and/or using a higher current strength present at the silicon substrate. The already etched porous silicon substrate is not further reduced during the course of the cavity etching process, since the etching solution does not attack at the sidewalls of the pores, but generally only at the bottom of the pores. Thus, the etching solution in each case gets to the bottom of the pores via the pores, and from there the underetching of the porous region begins. The size of the cavity can then be determined simply via the duration of the cavity etching process. By a subsequent oxidation, the silicon of the porous region is transformed into optically transparent silicon oxide.

In another further refinement of the example method according to the present invention, it is finally also possible to generate a cavity in the silicon substrate that is bordered by two optically transparent regions lying opposite to each other. For this purpose, after generation of the cavity, the etching process is simply continued under conditions in which the silicon substrate is etched porous, as a rule, until the silicon substrate is completely etched through.

BRIEF DESCRIPTION OF THE DRAWINGS

As discussed above, there are various possibilities for advantageously developing and further refining the teaching of the present invention. Reference is made to the following description of exemplary embodiments of the present invention on the basis of the drawings.

FIGS. 1a and 1b show a silicon substrate in two different states of an example method according to the present invention.

FIG. 5a shows a top view of a complex geometry.

FIG. 5b shows a section of the complex geometry.

DESCRIPTION OF EXAMPLE EMBODIMENTS

FIG. 1a shows a silicon substrate 1, whose one main surface 2 is furnished with an etching mask 3 of the kind commonly used during the etching of a silicon substrate. The material of etching mask 3 is selected in dependence upon the kind of etching procedure used. In conjunction with an electrochemical etching process, the use of a metal mask has proven to be particularly advantageous. In this case, the flux lines run perpendicular to the substrate surface, so that no underetching of the etching mask can appear. But the use of $n^+$ doping comes into consideration, a silicon nitride mask or a combination of $n^+$ doping and a silicon nitride mask.

After the application of etching mask 3 onto substrate surface 2, in the exemplary embodiment shown here, silicon substrate 1 was exposed to an electrochemical etching process in a hydrofluoric acid-containing medium. In such an etching process, the silicon substrate is positioned between an anode and a cathode in a hydrofluoric acid bath, the contacting of the silicon substrate taking place via the hydrofluoric acid bath. Since the material removal during current flow takes place at the anodic side of the silicon substrate, here substrate surface 2, such an etching process is also denoted as anodizing. Based on the doping of silicon substrate 1 shown here, as well as the anodizing conditions, i.e., of the concentration of the etching solution and the current strength, the unprotected areas of substrate surface 2 were etched porous. The porosity of the silicon substrate produced thereby was selected, in coordination with the subsequent oxidation process, in such a way that the volume growth that goes along with the oxidation does fill the pores in porous regions 5 and 6, to be sure, but does not lead to warping in silicon substrate 1. The depth of porous regions 5 and 6 was determined by the duration of the anodizing.

FIG. 1b shows silicon substrate 1 after the removal of etching mask 3 and after the oxidation. The porous silicon in regions 5 and 6 has here been completely converted to silicon oxide, which is optically transparent in the visible spectrum range. Porous silicon has a very large surface area, so that oxidation takes place very rapidly here. As a result, substrate surface 2 is only slightly oxidized, in spite of the complete oxidation of porous regions 5 and 6. Therefore, the silicon oxide on substrate surface 2 is easily removed. Silicon substrate 1 can subsequently be further processed, for example, by applying further doping, by metallizing, by depositing passivating layers, etc.

Figure 2:
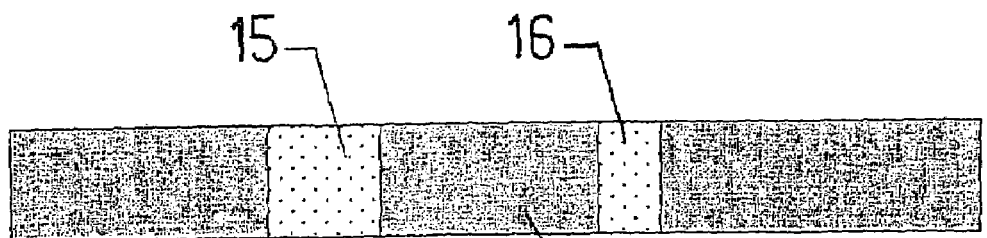
FIG. 2 shows an additional silicon substrate in which two optically transparent regions have been generated which extend over the entire thickness of the silicon substrate.

FIG. 2 shows an additional silicon substrate 11, in which, as explained in connection with FIGS. 1a and 1b, with the aid of the method according to the present invention, two optically transparent regions 15 and 16 have been generated which extend over the entire thickness of silicon substrate 11. To do this, anodizing was carried out until silicon substrate 11 had been etched porous over its entire thickness in regions 15 and 16 that were exposed to the etching action. Porous regions 15 and 16 thus generated were subsequently completely etched through.

Figure 3:
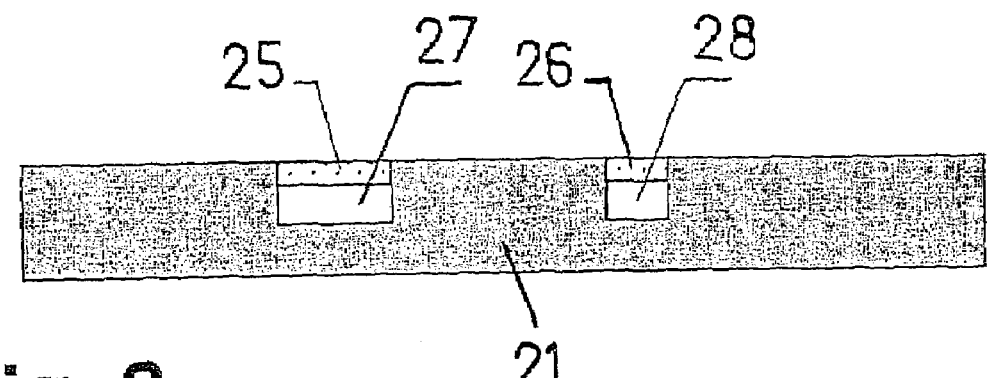
FIG. 3 shows a silicon substrate in which two optically transparent regions are formed over cavities.

FIG. 3 shows a silicon substrate 21, in which two optically transparent regions 25 and 26 are formed, each over a cavity 27 and 28, respectively, in silicon substrate 21. This structure was also generated with the aid of the method according to the present invention, in that the anodizing conditions were changed after the porous etching in regions 25 and 26 in such a way that the silicon under porous regions 25 and 26 were completely etched out. For this purpose, the concentration of the hydrofluoric acid solution was reduced and/or the current strength was increased. The size of cavities 27 and 28 was determined by the duration of the etching action, using changed anodizing conditions. On account of the subsequent oxidation, a structure in silicon substrate 21 has been created having cavities 27 and 28, or channels, and transparent regions 25 and 26 lying above them, with which, for example, optical measurements can be carried out on liquids of the smallest volumes.

Figure 4:
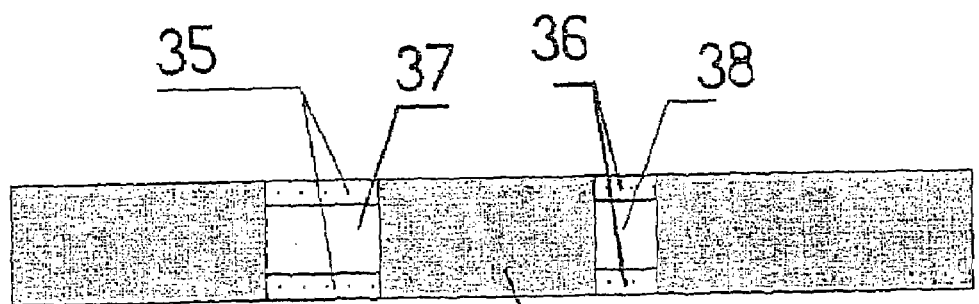
FIG. 4 shows a silicon substrate in which two optically transparent regions are formed over cavities.

FIG. 4 shows a silicon substrate 31, in which two optically transparent regions 35 and 36 are formed, each over a cavity 37 and 38, respectively. This part of the structure in silicon substrate 31 was also generated with the aid of the method according to the present invention, the same as the structure shown in FIG. 3. In the case of FIG. 4, the etching process was, however, continued after the etching of cavities 37 and 38 under the original etching conditions until all of the silicon under cavities 37 and 38 had been etched porous. The silicon under cavities 37 and 38 may also be, alternatively to this, etched porous by reversing the voltage applied originally during anodizing. This variant may prove particularly advantageous, since the silicon substrate is then etched from the direction of the underside, and the etching medium and also the etched-out silicon do not have to press through the already generated porous layers on the other side of the cavities. On account of the subsequent oxidation, a structure in silicon substrate 31 has been created here, having cavities 37 and 38 or channels which are bordered on both sides by optically transparent regions 25 and 26, so that, using this structure, for example, optical measurements may be carried out in transparency.

With the aid of the example method according to the present invention, structures having complex geometries may also be generated in a silicon substrate, such as the structure reproduced in FIGS. 5a and b in a top view and in section. In this context, a meander-shaped channel 48 is involved, which starts from an oval cavity 47 having an access opening 49 in substrate surface 42. Both cavity 47 and channel 48 are formed in silicon substrate 41 below regions 45 and 46 that are optically transparent and pass over into each other.

In the above-described exemplary embodiments, the optically transparent regions in a silicon substrate were always produced in a common etching process and underwent subsequent oxidation. Of course, the example method according to the current invention may also be applied several times in a row to a silicon substrate that is masked differently each time, in order to generate optically transparent regions having different depths, and also at different heights in the silicon substrate. Thus, in a first step, a first optically transparent region may be generated having a certain depth, by suitable masking of the substrate surface. Using a second masking, one could then generate a further optically transparent region having a different depth, or a transparent region which starts from a depression in the substrate surface that was generated before. In this manner, using the example method according to the present invention, complex depth profiles may be implemented in a silicon substrate which have transparent regions.

What is claimed is:

1. A method for generating optically transparent regions in a silicon substrate, comprising:
  etching, in a first etching process, at least one specified region of the silicon substrate to be porous;
  etching, in a second etching process after the first etching process, the silicon substrate to produce a cavity directly underneath the at least one specified porous region, wherein the second etching process is conducted under conditions in which the silicon substrate is completely etched out in the cavity; and
  oxidizing the at least one specified porous region of the silicon substrate;
  wherein in the silicon substrate, the cavity is produced bordered by two porous regions that lie opposite to each other, and wherein, after the generation of the cavity, a third etching process is continued under conditions in which the silicon substrate is etched porous.

2. The method as recited in claim 1, wherein the first etching step includes applying an electrochemical etching process to the at least one region of the silicon substrate.

3. The method as recited in claim 2, wherein the electrochemical etching process includes electrochemical anodizing.

4. The method as recited in claim 2, wherein the first etching step includes utilizing a hydrofluoric acid-containing medium as an etching solution.

5. The method as recited in claim 4, wherein the etching solution includes an aqueous hydrofluoric acid solution or a hydrofluoric acid mixture.

6. The method according to claim 5, wherein the etching solution includes at least one of alcohol and a wetting solution.

7. The method as recited in claim 2, further comprising:
  determining a porosity in the at least one specified region of the silicon substrate by at least one of: i) doping the silicon substrate, ii) a concentration of the etching solution, and iii) a strength of current present at the silicon substrate during the first etching process.

8. The method as recited in claim 1, wherein, in the specified region, a porosity is generated which is so great that pores in the specified region are completely closed by an increase in volume at complete oxidizing through of the specified region, without warping appearing in the silicon substrate.

9. The method as recited in claim 1, wherein in the specified region, a porosity of the silicon substrate of about 54% is generated.

10. The method as recited in claim 1, further comprising:
  determining a depth of the specified porous region by a duration of the first etching process.

11. The method as recited in claim 1, further comprising:
  producing an etching mask, the etching mask specifying at least one surface of the silicon substrate the region that is to be etched.

12. The method as recited in claim 11, wherein the etching mask includes one of a metal mask, an $n^+$ doping, an SiN layer or a combination of $n^+$ doping and an SiN layer.

13. The method as recited in claim 1, wherein the second etching process, relative to the first etching process, involves at least one of: i) using a lower concentration etching solution, and (ii) having a higher strength of current present in the silicon substrate.

14. The method as recited in claim 1, wherein a size of the cavity is determined by the duration of the second etching process.

15. The method of claim 1, wherein, during the second etching process, an etching solution passes through the at least one specified porous region without substantially etching the at least one specified porous region.

* * * * *